United States Patent
Labib et al.

(10) Patent No.: US 8,289,037 B2
(45) Date of Patent: Oct. 16, 2012

(54) METHOD AND APPARATUS TO MEASURE CURRENT IN POWER SWITCHERS

(75) Inventors: Rami Labib, Ottawa (CA); Marcos Vivas, Kanata (CA)

(73) Assignee: Alcatel Lucent, Paris (FR)

( * ) Notice: Subject to any disclaimer, the term of this patent is extended or adjusted under 35 U.S.C. 154(b) by 452 days.

(21) Appl. No.: 12/571,263

(22) Filed: Sep. 30, 2009

(65) Prior Publication Data
US 2011/0074384 A1   Mar. 31, 2011

(51) Int. Cl.
*G01R 27/08* (2006.01)
(52) U.S. Cl. ... 324/713; 323/283; 323/277; 324/764.01; 455/127.1
(58) Field of Classification Search ............ 324/713
See application file for complete search history.

(56) References Cited

U.S. PATENT DOCUMENTS

| | | | |
|---|---|---|---|
| 7,426,374 B2 * | 9/2008 | Dwelley et al. | 455/127.1 |
| 7,436,200 B1 * | 10/2008 | Jacobsen et al. | 324/764.01 |
| 2002/0130647 A1 * | 9/2002 | Sakamoto | 323/282 |
| 2002/0133789 A1 * | 9/2002 | Hsu et al. | 716/4 |
| 2006/0091896 A1 * | 5/2006 | Schrom et al. | 324/713 |
| 2007/0257646 A1 * | 11/2007 | Leutgeb et al. | 323/277 |
| 2008/0012584 A1 * | 1/2008 | Pai et al. | 324/713 |
| 2008/0253041 A1 * | 10/2008 | Kuivalainen et al. | 361/25 |
| 2009/0267582 A1 * | 10/2009 | Prodic et al. | 323/283 |
| 2010/0164516 A1 * | 7/2010 | Lammers et al. | 324/713 |

OTHER PUBLICATIONS

Linfinity Microelectronics, Linfinity Application Note AN-7, "A Simple Current-Sense Technique Eliminating a Sense Resistor" Jul. 1998.

* cited by examiner

*Primary Examiner* — Melissa Koval
*Assistant Examiner* — Benjamin M Baldridge
(74) *Attorney, Agent, or Firm* — Kramer & Amado, PC

(57) ABSTRACT

A method and an apparatus to measure current in power switching supplies are disclosed for simplification of in-circuit measurement. The method and apparatus to measure current include a sensing capacitor, which in series with a resistor, is placed across the output inductor of the power supply in order to utilize the parasitic resistance of the inductor, in conjunction with a measurement controller which performs initial calibration and temperature compensation. Initial and secondary measurements are performed using an adjustable current sink in order to eliminate thermal effects. The method and apparatus to measure current in power switching supplies are particularly useful for overcoming invasive measurement techniques for measuring current known in the art.

12 Claims, 4 Drawing Sheets

METHOD AND APPARATUS TO MEASURE CURRENT IN POWER SWITCHERS

FIELD

The present invention relates to measuring current in switching mode power supplies and is particularly concerned with current measurement that may be affected by onboard measuring circuitry.

BACKGROUND

Present electronic equipment makes extensive use of on-board switching mode power supplies to change voltage levels from that supplied to the card to levels required by on-board circuitry. Measuring the current of on-board power supply switchers without modifying the circuit or de-soldering and lifting components from the PCB can be problematical.

There are a number of ways of measuring electrical current flow through a conductor. One such method consists of inserting a current measuring device, such as an ammeter, in series with the conductor; however, this requires breaking the conductor at the point of insertion. In many cases, such as with printed circuit boards, this breaking and inserting is difficult and inconvenient. Alternatively, removable components may be used, for example, a shorting link, which can be removed and then replaced, but this incurs the additional cost and space of such a component and its connector.

Preferably, the current measurement can be made non-invasively, for example, by detecting the magnetic field surrounding the conductor carrying the current. Referring to FIG. 1, there may be seen a switching mode power supply 100 having an output stage 110 with an output filter inductor 111. Conductive loop 112 connects the output stage 110 of filter inductor 111 with an output filter capacitor 114. Output voltage feedback line 116 connects the voltage on output filter capacitor 114 to regulation stage 118. Also seen is output load 120 which represents the load that switching mode power supply 100 is feeding. Magnetic probe 122 surrounds conductive loop 112 so as to sense the magnetic field produced by the output current. Magnetic probe 122 is connected to measuring instrument 124, which may be an averaging oscilloscope or other measurement device, which allows the magnitude of the current flowing through output filter inductor 111 to be ascertained. This approach has the disadvantage that inductance of conductive loop 112 and magnetic probe 122 changes the operational characteristics of the output circuit and may even cause loop instability if the applied inductance is comparable to a significant portion of the value of output filter inductor 111. As well, such a manual approach requires set up time and space which makes for measurement difficulties while the circuit card containing switching mode power supply 100 is in operation in an equipment shelf, or environmental test chambers. Additionally if measurements are going to be in the shelf and/or in the environmental chamber, size of the current probe is a limiting factor that may make it impossible to do the measurement.

A second possible solution uses a series resistor connected either in series with the output inductor or at the output of the switches in series with the load. Referring to FIG. 2, there may be seen a switching mode power supply 200 having an output stage 210 with an output filter inductor 211. Sense resistor 212 connects the output stage 210 of filter inductor 211 with an output filter capacitor 214. Output voltage feedback line 216 connects the voltage on output filter capacitor 214 to regulation stage 218. Also seen is output load 220 which represents the load that switching mode power supply 100 is feeding. Voltage sense leads 222 carry the voltage developed across sense resistor 212 to measurement unit 224. For high output current power supplies this approach is problematical at high currents due to the power dissipation developed within the sense resistor 212, as well as the addition to output impedance offered by the sense resistor 212. Further, the thermal losses in sense resistor 212 contribute to a loss in efficiency in the power supply 200. While possible implementations utilizing a plurality of resistors in parallel to cope with the power dissipation may be used, the real-estate cost issues on the circuit board are generally prohibitive.

A third possible approach is disclosed in an application note AN-7 "Loss-Less Current Sense Technique", by LinFinity Microelectronics, incorporated by reference. This note describes a sense technique utilizing the parasitic resistance, $R_L$, of the output filter inductor to sense the inductor current. A sensor consisting of a sense resistor $R_S$ and a sense capacitor $C_S$ are connected in series. The resultant assemblage is connected directly in parallel with the output filter inductor. The voltage $V_{C_S}$ across sense capacitor $C_S$ is the sensor's output and is proportional to the output current of the inductor.

Referring to FIG. 3, there may be seen a switching mode power supply 300 having an output stage 310 with an output filter inductor 311. Sense resistor 312 and sense capacitor 313 are connected in series, and the resultant assemblage is connected across filter inductor 311. The output of filter inductor 311 is connected with output filter capacitor 314. Output voltage feedback line 316 connects the voltage on output filter capacitor 314 to regulation stage 318. Also seen is output load 320 which represents the load that switching mode power supply 300 is feeding. Voltage sense leads 322 carry the voltage developed across sense capacitor 313 to measurement unit 324.

A disadvantage of this solution is that it must be designed up front to be compatible with the output filter inductor 311. The values of sense resistor 312 and sense capacitor 313 are calculated as a function of the DC resistance value of output filter inductor 311. Typical manufacturer datasheets of the types of inductors used for output filter inductor 311 have wide tolerances which can result in measurement errors on the order of +1-10% due to variations in the nominal DC resistance. Further, as the windings of output inductor 311 will show a temperature dependency, further errors are introduced. Laboratory measurements have resulted in variations of up to 4% of error of the measured value per 10° C. As temperature rises of over 35° C. are not uncommon for this type of output inductor, it may be seen that considerable error can be introduced during operation. Attempts to compensate for the operating temperature are not simple, in that the effective operating temperature can be a function of power supply load, local ambient temperature, and surrounding cooling conditions. In general, this requires a complex method of measurement of output filter inductor's 311 temperature in order to compensate, and this works against a non-invasive measurement technique.

Therefore, it would be desirable to provide a circuit for non-invasively measuring current at the output of a switching mode power supply without the drawbacks described above and that would be applicable to existing circuit boards.

SUMMARY

It is an object of the invention to provide a system for non-invasively measuring switching mode currents through an output inductor of a power supply comprising a sense capacitor; a sense resistor in series with the sense capacitor to form a series RC circuit, wherein the series RC circuit is connected in parallel with the output inductor; an adjustable current sink attached between an output side of the parallel combination of the series RC circuit and the output inductor and ground; and a measurement unit which adjusts the current sink to a plurality of values, measures a respective change in voltage developed across the sense capacitor at each of the plurality of values, calculates an average parasitic resistance from the plurality of measurements, and calculates an output current based upon the calculated average parasitic resistance.

According to an aspect of the invention, there is provided a calibration function in the measurement unit for initial calculations of the parasitic resistance.

In some embodiments of the invention, a connection circuit for connects the measurement unit to a local area network connection Advantageously, the connection circuit is a wireless connection.

According to another aspect of the invention, there is provided a method for non-invasively measuring current through an output inductor of a switch mode power supply comprising: connecting a series RC circuit of a sense resistor and a sense capacitor, wherein the series RC circuit is connected in parallel with the output inductor; connecting an adjustable current sink between an output of the parallel combination of the series RC circuit and the output inductor and ground; measuring a baseline voltage developed across the sense capacitor with zero current flowing through the adjustable current sink; measuring an initial voltage change from the baseline voltage developed across the sense capacitor at an initial current through the adjustable current sink; measuring a second voltage change from the baseline voltage across the sense resistor at a second current through the adjustable current sink different from the initial current; calculating an average parasitic resistance for the output inductor based upon the initial and second currents and initial and second voltage change measurements; and calculating an output current based upon the calculated average parasitic resistance and the baseline voltage measured across the sense capacitor.

Some embodiments of the invention include performing an initial calibration calculation on the value of the parasitic resistance of the output inductor.

Advantageously, embodiments of the invention could be used for communicating said calculated output current to a storage device. The communicating may occur over a local area network, such as a wireless network.

Note: in the following, the description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

It should be further appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

BRIEF DESCRIPTION OF THE DRAWINGS

The present invention will be further understood from the following detailed description of embodiments of the invention, with reference to the drawings in which.

DETAILED DESCRIPTION

Figure 1:
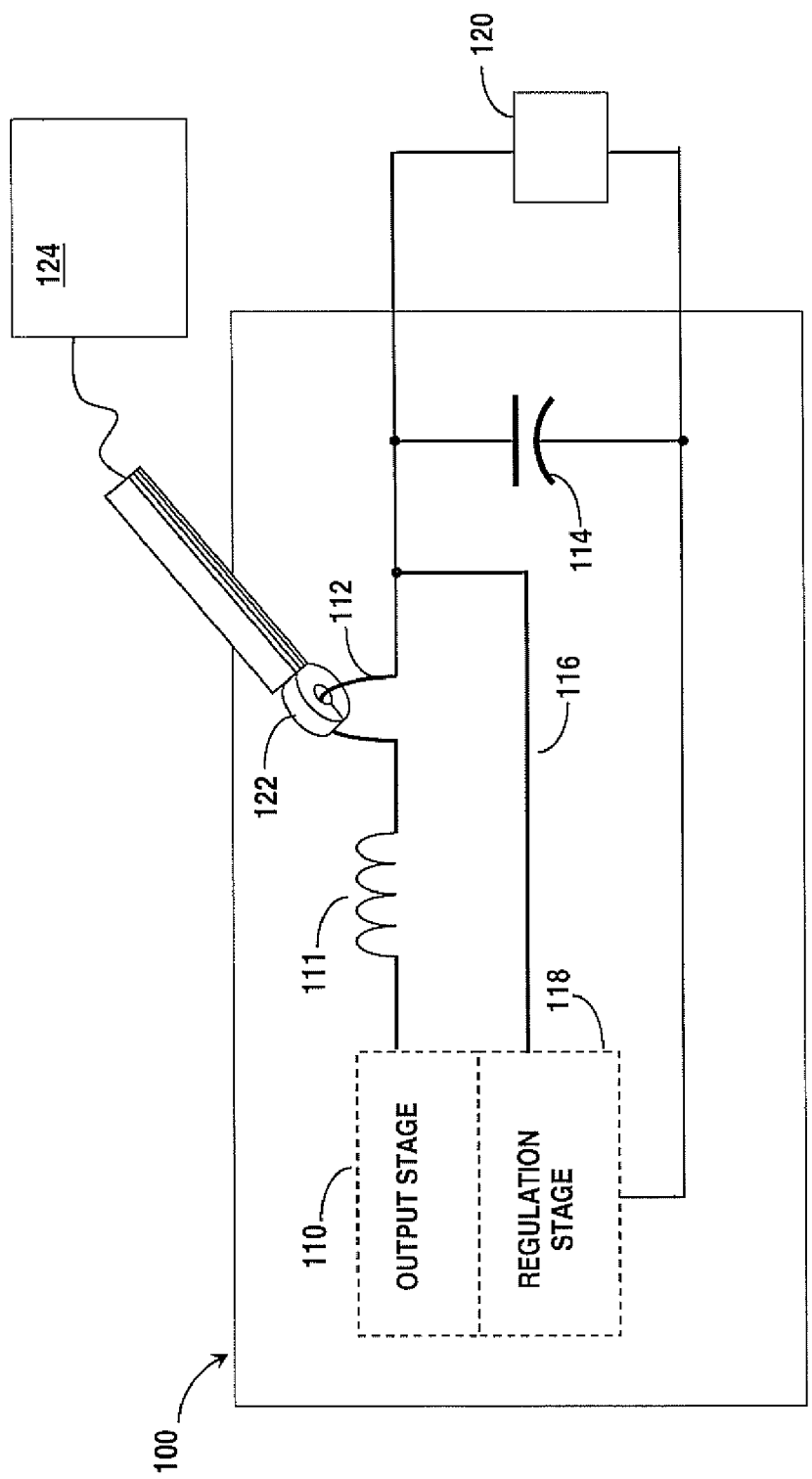
FIG. 1 illustrates a known method of measuring current from a power supply.
Figure 2:
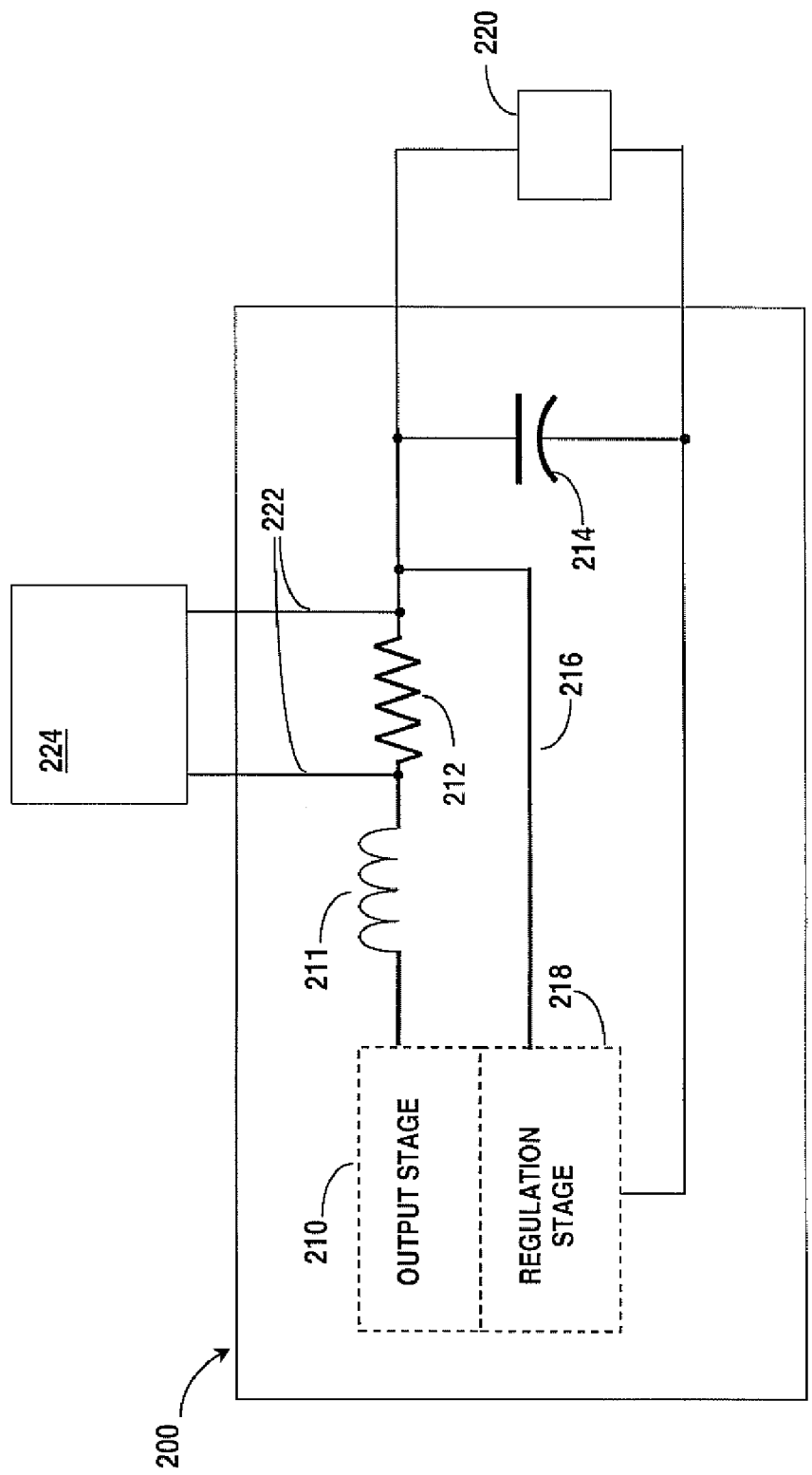
FIG. 2 illustrates another known method of measuring current from a power supply using a sense resistor.
Figure 3:
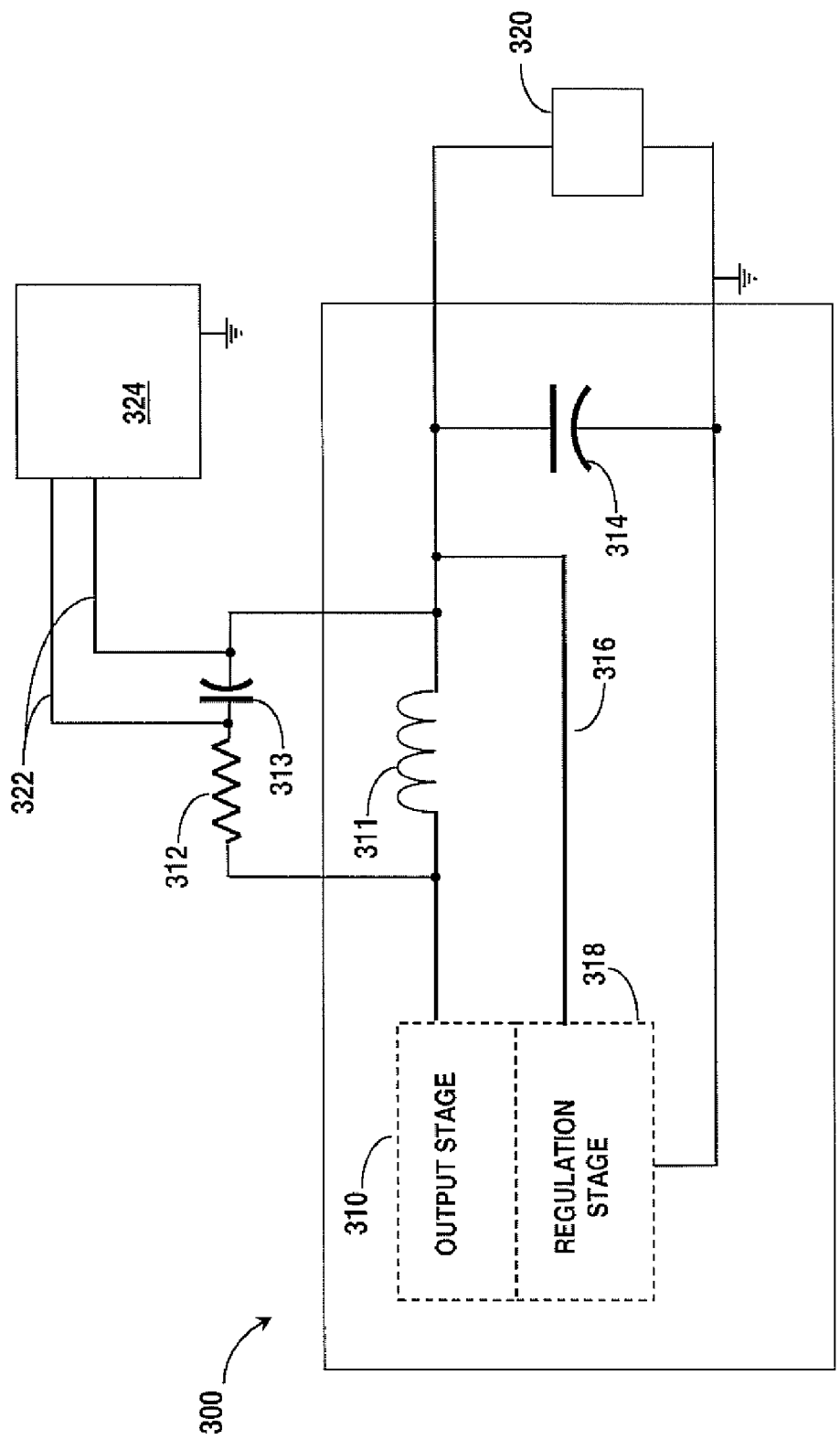
FIG. 3 illustrates an apparatus for measuring current in from a power supply using an RC sense circuit.
Figure 4:
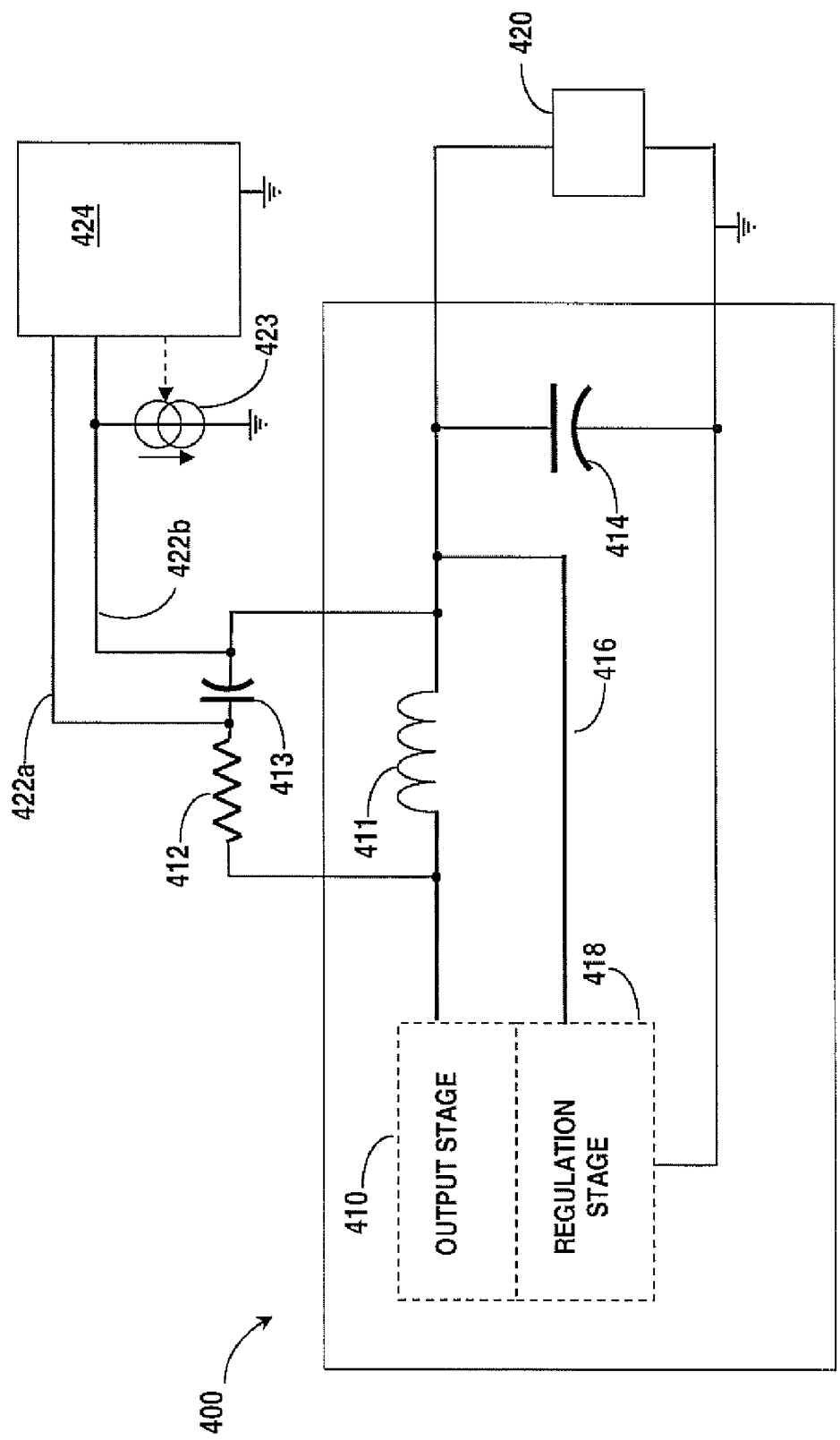
FIG. 4 illustrates an apparatus for measuring current in accordance with an embodiment of the present invention.

Referring to FIG. 4, there may be seen a switching mode power supply 400 having an output stage 410 with an output filter inductor 411. Sense resistor 412 and sense capacitor 413 are connected in series, and the resultant assemblage is connected across a filter inductor 411. The output of filter inductor 411 is connected with an output filter capacitor 414. Output voltage feedback line 416 connects the voltage on output filter capacitor 414 to regulation stage 418. Also seen is output load 420 which represents the load that switching mode power supply 400 is feeding. Voltage sense leads 422a and 422b carry the voltage developed across sense capacitor 414 to measurement unit 424. Also attached to voltage sense lead 422b is adjustable current sink 423. Adjustable current sink 423 is under the control of measurement unit 424, and may be controlled to draw varying amounts of current from output inductor 411.

Sense resistor 412 and sense capacitor 413 may have values as calculated for the nominal DC resistance of output filter inductor 411 as given by manufacturer's technical specifications and the procedure outlined in AN-7 "Loss-Less Current Sense Technique".

According to an embodiment, the following method may be then used to measure the output current through filter inductor 411 during operation of switching mode power supply 400:

1) Measure an initial voltage $V_0$ across sense capacitor 413 with no current drawn at current sink 423;

2) Adjust current sink 423 to initial current $I_1$;

3) Measure the resultant voltage change $V_1$ developed across sense capacitor 413 from initial voltage $V_0$;

4) Adjust current sink 423 to a second current $I_2$ which is different from initial current $I_1$;

5) Measure the second resultant voltage change $V_2$ developed across sense capacitor 413 from initial voltage $V_o$;

6) Calculate an average parasitic resistance for filter inductor 411 as:

$$R_P = [(V_1/I_1)+(V_2/I_2)]/2$$

7) Calculate an output current value $$I_{OUT} = V_0/R_P$$

Voltage measurements and current sink settings are done by measurement unit 424. It is assumed for the purposes of this method that the times between measurements of voltages $V_1$ and $V_2$ are done with a sample time significantly less than the thermal time constant of output filter inductor 411.

The disclosed method does not require previous accurate knowledge of the parasitic resistance value of filter inductor 411. Nor does it require any thermal compensation temperature measurements. The programmable current source will calibrate/characterize the inductor parameters including ongoing thermal effects. The net result is a non-invasive current measurement with considerably more accuracy than previous solutions. Laboratory test results indicate measurement accuracies improved to the ~1% range as a result of the aforedisclosed method.

According to an embodiment, measurement unit 424 incorporates a signal processing controller. Programmed functions initiated by operator controls execute the measurements. Under contemplated embodiments, measurement unit 424 may be connected to a local area network, either by LAN cabling or via wireless connections. Measurement unit 424 may be operated remotely, reporting measurement results over sustained periods of time, for example, while a power supply is undergoing environmental stress testing. Alternatively, measurement unit 424 may incorporate local readout devices, displaying information via an integrated display. Also alternatively, calculated results may be brought to a measurement port for reading of the results by an external Multimeter or conducted to an analog-to-digital converter for digitization and reporting via a data collection system.

Under another embodiment, measurement unit 424 incorporates a calibration function for calculation of an initial estimate of the parasitic resistance of the inductor. This is accomplished by applying specific current values through the sense leads 422a and 422b prior to operation.

As may be recognized by one skilled in the art, this solution can also be integrated on a diagnostics module to perform the current measurement features to sub system power modules.

Numerous modifications, variations and adaptations may be made to the embodiment of the invention described above without departing from the scope of the invention, which is defined in the claims.

What is claimed is:

1. A system for non-invasively measuring switching mode power supply currents through an output inductor of a power supply comprising:
    a sense capacitor;
    a sense resistor in series with said sense capacitor to form a series RC circuit; said series RC circuit connected in parallel with said output inductor;
    an adjustable current sink attached between an output side of said parallel combination of the series RC circuit and the output inductor and ground; and
    a measurement unit which adjusts said current sink to a plurality of non-zero values, measures a respective change in voltage developed across said sense capacitor at each of said plurality of non-zero values, calculates an average parasitic resistance from said plurality of measurements, and calculates an output current based upon said calculated average parasitic resistance.

2. The system as claimed in claim 1, further comprising:
    a calibration function in said measurement unit that performs initial calculations of said parasitic resistance.
3. The system as claimed in claim 1, further comprising:
    a connection circuit that connects said measurement unit to a local area network connection.
4. The system as claimed in claim 3, wherein said connection circuit makes a wireless connection to the local area network.
5. A method for non-invasively measuring current through an output inductor of a switching mode power supply comprising:
    connecting a series RC circuit of a sense resistor and a sense capacitor, wherein the series RC circuit is connected in parallel with the output inductor;
    connecting an adjustable current sink between an output of said parallel combination of the series RC circuit and the output inductor and ground;
    measuring a baseline voltage developed across said sense capacitor with zero current flowing through said adjustable current sink;
    measuring an initial voltage change from said baseline voltage developed across said sense capacitor at an initial non-zero current through said adjustable current sink;
    measuring a second voltage change from said baseline voltage across said sense resistor at a second non-zero current through said adjustable current sink different from said initial non-zero current;
    calculating an average parasitic resistance for said output inductor based upon the initial and second non-zero currents and initial and second voltage change measurements; and
    calculating an output current based upon said calculated average parasitic resistance and said baseline voltage measured across said sense capacitor.
6. The method as claimed in claim 5, further comprising:
    performing an initial calibration calculation on the value of the parasitic resistance of said output inductor.
7. The method as claimed in claim 5, further comprising:
    communicating a value of said calculated output current to a storage device.
8. The method as claimed in claim 7, wherein said communicating occurs over a local area network.
9. The method as claimed in claim 8, wherein said local area network comprises a wireless network.
10. The method of claim 5, wherein both measuring the initial voltage change and measuring the second voltage change are done with a sample time significantly less than a thermal time constant of the output inductor.
11. The method of claim 5, further comprising:
    calibrating inductor parameters.
12. The method of claim 11, wherein the calibrated inductor parameters include ongoing thermal effects.

* * * * *